(12) United States Patent
Hashimoto

(10) Patent No.: US 7,022,913 B2
(45) Date of Patent: Apr. 4, 2006

(54) ELECTRONIC COMPONENT, METHOD OF MANUFACTURING THE ELECTRONIC COMPONENT, AND ELECTRONIC APPARATUS

(75) Inventor: Nobuaki Hashimoto, Suwa (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 11/019,032

(22) Filed: Dec. 20, 2004

(65) Prior Publication Data

US 2005/0190528 A1  Sep. 1, 2005

(30) Foreign Application Priority Data

Jan. 9, 2004 (JP) .............................. 2004-004692
Nov. 15, 2004 (JP) .............................. 2004-330289

(51) Int. Cl.
*H02G 5/00* (2006.01)

(52) U.S. Cl. ..................... 174/52.1; 174/260; 174/262; 257/691; 257/738

(58) Field of Classification Search ............... 174/52.1, 174/260, 262; 257/738, 691; 439/55, 65
See application file for complete search history.

(56) References Cited

U.S. PATENT DOCUMENTS

| 5,541,450 | A  | * | 7/1996 | Jones et al. | 257/697 |
| 6,218,731 | B1 | * | 4/2001 | Huang et al. | 257/738 |
| 6,452,807 | B1 | * | 9/2002 | Barrett | 361/787 |
| 6,727,116 | B1 | * | 4/2004 | Poo et al. | 438/106 |
| 2001/0017411 | A1 | * | 8/2001 | Terui | 257/734 |
| 2004/0089936 | A1 | * | 5/2004 | Shizuno | 257/686 |

FOREIGN PATENT DOCUMENTS

| JP | 11-087402 | 3/1999 |
| JP | 2002-050738 | 2/2002 |
| JP | 2002-170904 | 6/2002 |

* cited by examiner

*Primary Examiner*—Hung V. Ngo
(74) *Attorney, Agent, or Firm*—Harness, Dickey & Pierce, P.L.C.

(57) ABSTRACT

An electronic component includes a substrate; a functional part that is formed beneath at least one of a front face and a bottom face of the substrate and that performs a predetermined function; a plurality of terminals that is formed on the front face or the bottom face of the substrate and that is connected to the functional part; a plurality of outer electrodes formed on the front face and the bottom face of the substrate; and interconnection lines, formed on the front face and the bottom face of the substrate, for connecting the terminals on the front face or the bottom face of the substrate to the outer electrodes.

20 Claims, 6 Drawing Sheets

ELECTRONIC COMPONENT, METHOD OF MANUFACTURING THE ELECTRONIC COMPONENT, AND ELECTRONIC APPARATUS

CROSS-REFERENCE TO RELATED APPLICATIONS

The entire disclosures of Japanese Patent Application Nos. 2004-330289 filed Nov. 15, 2004 and 2004-004692 filed Jan. 9, 2004 are hereby incorporated by reference.

BACKGROUND OF THE INVENTION

1. Field of the Invention

The present invention relates to an electronic component, such as a semiconductor device, which is a module having a single active device or at least one active element and at least one passive element, to a method of manufacturing the electronic component, and to an electronic apparatus in which the electronic component is mounted.

2. Description of the Related Art

A known semiconductor device has a semiconductor element having through-holes formed at the positions of electrodes, insulating materials provided in areas including the inner sides of the through-holes, and conductive members provided around the central axes of the through-holes (for example, refer to Japanese Unexamined Patent Application Publication No. 2002-50738; claim 18, paragraphs [0035], [0036], and [0050] to [0075], and FIGS. 1 and 2). This semiconductor device is hereinafter referred to as a first related art.

In another known semiconductor device, wiring is formed on an insulating layer provided at the terminal side of a semiconductor chip. The wiring is electrically connected to the terminal through a first via section passing through a terminal area in the insulating layer. The wiring is connected to a second via section passing through the semiconductor chip. A bump is formed as an external terminal at the second via section at a side opposing to the terminal side of the semiconductor chip (for example, refer to Japanese Unexamined Patent Application Publication No. 2002-170904; claim 6, paragraphs [0007] and [0012] to [0014], and FIG. 3). This semiconductor device is hereinafter referred to as a second related art.

A known electronic component has semiconductor devices flip-chip mounted on a multilayer circuit board having a first surface layer, a second surface layer, and a bonding layer for bonding the first surface layer to the second surface layer. The electronic component has a first semiconductor device flip-chip mounted on the first surface layer; a first substrate terminal that is formed on the first surface layer in a first area beneath the first semiconductor device and that is electrically connected to an electrode of the first semiconductor device; first internal wiring formed in a first bonding plane where the first surface layer is boned to the bonding layer; a first conductive hole, formed in the first area, for electrically connecting the first substrate terminal to the first internal wiring; a second semiconductor device flip-chip mounted in an area, on the second surface layer, which is plane symmetric with the area in which the first semiconductor device is mounted with respect to the bonding layer; a second substrate terminal that is formed in a second area beneath the second semiconductor device and that is electrically connected to an electrode of the second semiconductor device; second internal wiring formed in a second bonding plane where the second surface layer is bonded to the bonding layer; and a third conductive hole, formed in the second area, for electrically connecting the second substrate terminal to the second internal wiring (for example, refer to Japanese Unexamined Patent Application Publication No. 11-87402; claim 13, paragraphs [0031] and [0067] to [0069], and FIG. 6). This electronic component is hereinafter referred to as a third related art.

The object of the first related art is to reduce the size of the semiconductor device. The object of the second related art is to suppress an occurrence of chip clack or curvature caused by a change in temperature in a state in which the semiconductor device is mounted on a mount board. The object of the third related art is to relieve stress or modifications occurring on the surface layers to improve the reliability of the electronic component. The structures of the semiconductor devices and the electronic component appropriate for achieving the corresponding objects are disclosed in the first to third related arts. In order to mount these semiconductor devices or the electronic component on mount boards, it is necessary to use mounters, as in conventional cases. Mounters are expensive because they have components requiring high precision and high sensitivity. For example, even a suction part in the mounter has many electronic components including a suction nozzle for sucking the electronic components, a feeder for feeding the electronic components toward the neighborhood of the nozzle at predetermined intervals, a sensor for detecting a failure in suction at the suction nozzle for the electronic components, and an XY stage for correcting the positions where the electronic components are sucked. Hence, an electronic apparatus manufactured by mounting the electronic components by using such an expensive mounter is also expensive.

As a result, the price of the electronic apparatus, for example, an integrated circuit (IC) card, which includes a small number of electronic components to be mounted but which is manufactured in large quantities, is increased. Furthermore, a display device that uses a display, such as an organic light emitting diode (OLED), a plasma display panel (PDP), or a liquid crystal display (LCD), has a large number of data drivers, having the same shape and function, mounted therein. The data driver applies a data signal to a data electrode corresponding to the display based on display data, corresponding to one line, supplied from an external device. One data driver is provided for multiple pixels (for example, 330 pixels). Accordingly, the larger the display, the greater the number of data drivers to be mounted. When it is necessary to use the expensive mounter described above in this type of display device, despite the fact that a higher mount precision of the data drivers is not required, the price of the display device becomes expensive.

In known semiconductor device, external connection terminals for use in connection to other devices and connecting lines for connecting the external connection terminals to terminals on a semiconductor chip are formed on only one face of the semiconductor device. Hence, only the determined face of the semiconductor device can be mounted on a mount board. Furthermore, there are problems in reduction of the reliability and/or shortening of the life due to thermal stress in known semiconductor devices.

SUMMARY OF THE INVENTION

Accordingly, in order to resolve the problems described above, a first object of the present invention is to provide an electronic component that is easily mounted on a mount board by using either the front face or the bottom face of the electronic component, such as a semiconductor device, which is a module including a single active element or at least one active element and at least one passive element. A second object of the present invention is to provide the electronic component that suppresses reduction of the reliability and/or shortening of the life caused by any thermal stress being applied. A third object of the present invention is to provide the electronic component that is mounted by using simple and inexpensive means without using an expensive mounter. In addition, it is another object of the present invention to provide a method of manufacturing the electronic component and an electronic apparatus including the electronic component.

The present invention provides, in its first aspect, an electronic component including a substrate; a functional part that is formed beneath at least one of a front face and a bottom face of the substrate and that performs a predetermined function; a plurality of terminals that is formed on the front face or the bottom face of the substrate and that is connected to the functional part; a plurality of outer electrodes formed on the front face and the bottom face of the substrate; and interconnection lines, formed on the front face and the bottom face of the substrate, for connecting the terminals on the front face or the bottom face of the substrate to the outer electrodes.

Since the electronic component of the present invention has the outer electrodes connected to the terminals on the functional part through the interconnection lines on both the front face and the bottom face of the substrate having the functional part, it is possible to mount the front face, the bottom face, or both the front face and the bottom face of the electronic component on a mount board, thus remarkably increasing the flexibility in mounting. This structure allows an electrical inspection to be performed after the electronic component is mounted.

The distance between two adjacent outer electrodes among the plurality of outer electrodes is preferably larger than the distance between two adjacent terminals among the plurality of terminals. This structure improves the mount efficiency of the electronic component and/or the connection efficiency between the electronic component and an external device.

It is preferable that stress relief layers be formed on the front face and the bottom face of the substrate and that the outer electrodes and the interconnection lines be formed on the stress relief layers. The provision of the stress relief layers on the front face and the bottom face of the substrate realizes the electronic component that can suppress reduction in the reliability or shortening of the life even with thermal stress being applied.

It is preferable that the plurality of outer electrodes on the front face of the substrate be plane symmetric with the plurality of outer electrodes on the bottom face of the substrate, that the outer electrodes connected to the same terminal be provided on both the front face of the substrate and the bottom face thereof, and that the outer electrodes connected to the same terminal be line or point symmetric with each other on both the front face of the substrate and the bottom face thereof.

The electronic component having the structure according to the present invention, which does not require the discrimination between the front face and the bottom face of the substrate, can adopt a mounting method by using vibration positioning in which the electronic components are guided to predetermined positions on a mount board while the electronic components are vibrated or a mounting method by using external-shape positioning in which the electronic components are fit in predetermined positions based on their external shapes. Hence, there is no need to use an expensive mounter, thus largely simplifying the mounting process. As a result, it is possible to reduce the price of the electronic apparatus, such as an IC card, which includes a small number of electronic components to be mounted but which is manufactured in large quantities. Furthermore, the price of a display device that uses a large display, such as an OLED, a PDP, or an LCD, and that has a large number of data drivers mounted therein can also be reduced.

The terminals are preferably formed on the front face or the bottom face of the substrate through corresponding through-holes or plugs extending through the substrate. With this structure, the terminals in the functional part can be led from the front face of the substrate to the bottom face thereof without wiring lines.

The through-holes or plugs are preferably formed immediately below the corresponding terminals. Since no active element ordinarily exists below the terminal, the above structure eliminates the need for allocating an area in the functional part only for forming the through-hole or plug, thus minimizing the area of the functional part, further, of the substrate. In addition, with this structure, the terminals essential to the electronic component are utilized, so that a general-purpose component can be used without requiring a custom design of the electronic component, further, of the semiconductor device.

The outer electrodes connected to the same terminal are preferably subjected to the same surface finishing in the electronic component described above. In this case, since there is no need to discriminate between the front face of the substrate and the bottom face thereof for mounting the electronic component, the same mounting method including reflow mounting, flip-chip mounting, or face-down mounting can be used to remarkably simplify the mounting process.

The surface of each of the outer electrodes is preferably subjected to the surface finishing using gold or solder in the electronic component described above. In this case, a common mounting method can be used to remarkably simplify the mounting process.

The substrate is preferably square in the electronic component described above. Since there is no need to discriminate the orientation of the semiconductor device in this case, the mounting process can be remarkably simplified.

The width and depth of the electronic component is preferably larger than the thickness thereof in the electronic component described above. With this structure, the electronic component can be stably fit in a recess in which the electronic component is to be fit.

The substrate may be a semiconductor substrate and the functional part may include at least one active element formed on the semiconductor substrate. With this structure, it is possible to mount the electronic component, which is a semiconductor device, with simple and inexpensive means.

The functional part may include a semiconductor device mounted on the substrate. With this structure, the electronic component, such as a module, can be mounted with simple and inexpensive means.

The electronic component may be a multilayer electronic component in which the electronic components described above are arbitrarily combined with each other and are layered through the outer electrodes. Alternatively, the electronic component may be a multilayer electronic component in which the electronic components and other components are layered through the outer electrodes. With these structures, the packaging density of the semiconductor devices can further increased.

The present invention provides, in its second aspect, a method of manufacturing an electronic component. The method includes steps of forming a functional part, performing a predetermined function, beneath at least one of a front face and a bottom face of a substrate; leading a plurality of terminals from one of the two faces to the other faces thereof, the terminals being connected to the functional part and extending through the substrate; and forming a plurality of outer electrodes on the front face and the bottom face of the substrate to connect the outer electrodes to the corresponding terminals.

It is possible to mount the front face, the bottom face, or both the front face and the bottom face of the electronic component, manufactured by the above method, on a mount board, thus remarkably increasing the flexibility in mounting. Since the outer electrodes are formed on both the front face and the bottom face of the substrate, an electrical inspection can be performed after the electronic component is mounted.

The step of forming the plurality of outer electrodes, in the above method, is preferably performed on stress relief layers after the stress relief layers are formed on the front face and the bottom face of the substrate.

In the electronic component manufactured by this method, the presence of the stress relief layers remarkably improves the reliability of the temperature cycle resistance when there is a difference in the thermal expansion coefficient between the mount board after the electronic component is mounted and the electronic component.

In the step of forming the plurality of outer electrodes, the plurality of outer electrodes on the front face of the substrate are preferably plane symmetric with the plurality of outer electrodes on the bottom face of the substrate, and the outer electrodes connected to the same terminal are preferably line or point symmetric with each other on both the front face of the substrate and the bottom face thereof.

The electronic component manufactured by this method, which does not require the discrimination between the front face and the bottom face of the substrate, can adopt a mounting method by using vibration positioning in which the electronic components are guided to predetermined positions on a mount board while the electronic components are vibrated or a mounting method by using external-shape positioning in which the electronic components are fit in predetermined positions based on their external shapes. Hence, there is no need to use an expensive mounter, thus largely simplifying the mounting process. As a result, it is possible to reduce the price of the electronic apparatus, such as an IC card, which includes a small number of electronic components to be mounted but which is manufactured in large quantities. Furthermore, the price of a display device that uses a large display, such as an OLED, a PDP, or an LCD, and that has a large number of data drivers mounted therein can also be reduced.

The present invention provides, in its third aspect, an electronic apparatus in which any of the electronic components described above is mounted. Since the electronic component can be easily mounted in the electronic apparatus in various manners, it is possible to reduce the size and cost of the electronic apparatus. Furthermore, the electronic apparatus in which the electronic component having the outer electrodes and the interconnection lines formed on their stress relief layers is mounted can improve its reliability and/or lengthen its life as the reliability of the electronic component is improved.

DESCRIPTION OF THE PREFERRED EMBODIMENTS

First Embodiment

Figure 1:
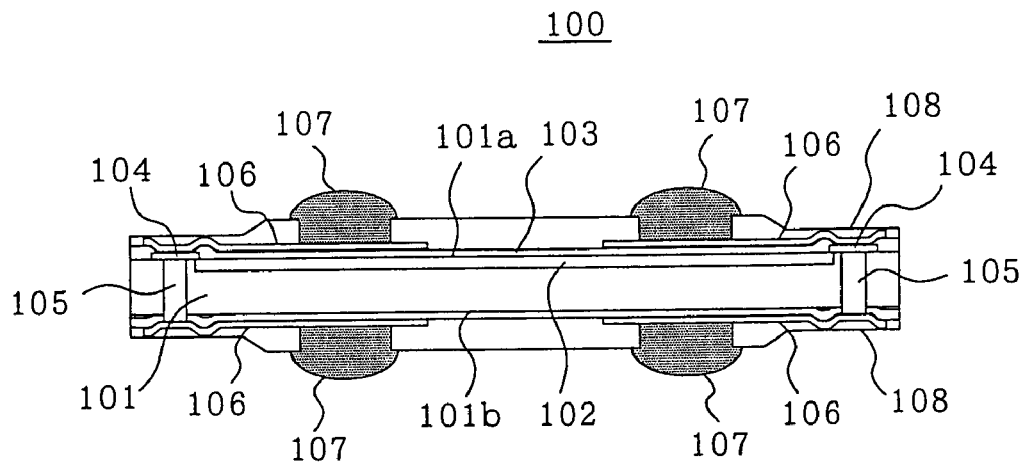
FIG. 1 is a schematic cross-sectional view showing the structure of a semiconductor device according to a first embodiment of the present invention.
Figure 2:
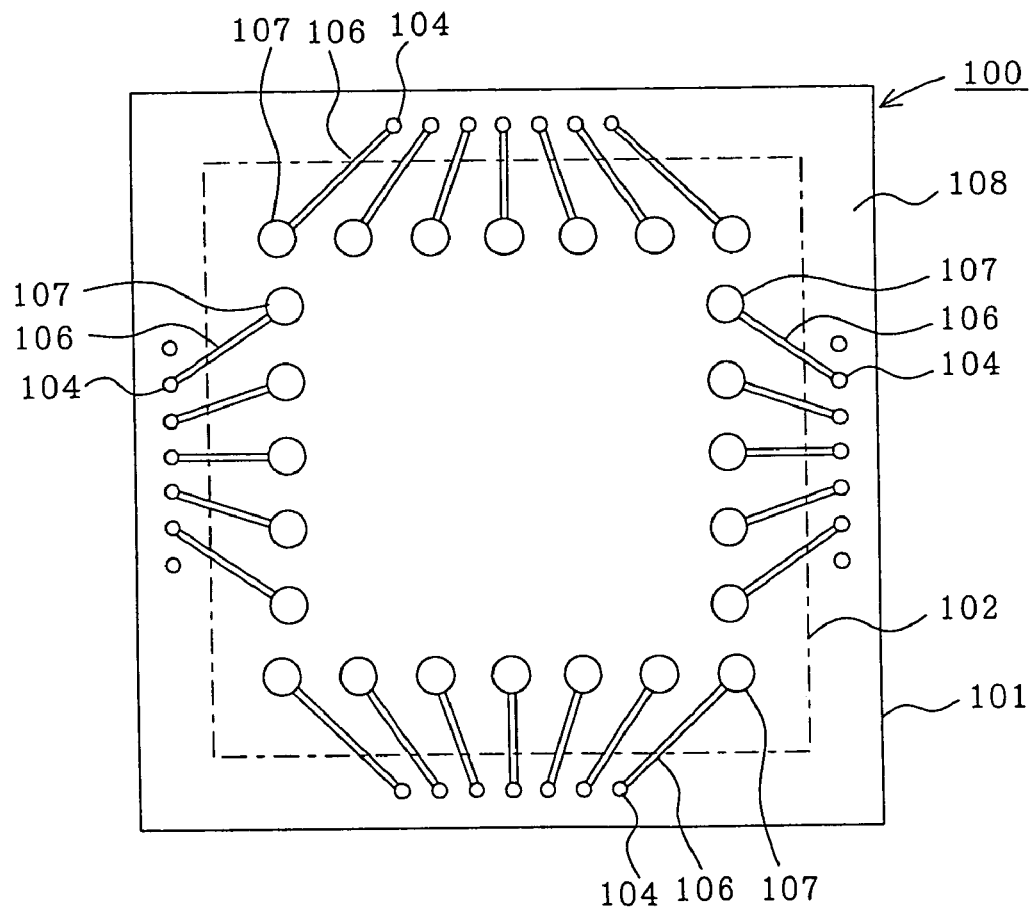
FIG. 2 is a plan view showing the front face of the semiconductor device according to the first embodiment of the present invention.

FIG. 1 is a sectional view showing the structure of a semiconductor device 100, which is an electronic component according to a first embodiment of the present invention. FIG. 2 is a plan view showing the front face of the electronic component shown in FIG. 1. The semiconductor device 100 has a silicon substrate 101. A functional part 102 is formed beneath a front face 101a of the silicon substrate 101. A passivation layer 103, made of silicon nitride (SiN), silicon oxide (SiO), or the like, is preferably formed on the functional part 102. The functional part 102 has a single active element or at least one active element and at least one passive element. In order to carry out a predetermined function, the functional part 102 performs a variety of signal processing, including arithmetic processing, image processing, speech synthesis, sound analysis, noise reduction, frequency analysis, encryption, decryption, and authentication, for input signals supplied from input terminals to generate output signals that are output from output terminals. The functional part 102 ordinarily has, in addition to the input and output terminals, a power terminal for supplying a power-supply voltage and a ground terminal for supplying a ground voltage. The input and output terminals, the power terminal, and the ground terminal are collectively referred to as terminals 104.

Each of the terminals 104 formed on the front face (top face) 101*a* of the silicon substrate 101 is led to a bottom face (rear face) 101*b* of the silicon substrate 101 through a though-hole or plug 105 passing through the silicon substrate 101. Each terminal 104 led from the front face 101*a* to the bottom face 101*b* is electrically connected to the corresponding outer electrode (connecting terminals to an external device or a cable) 107 through the corresponding interconnection line 106 formed on the silicon substrate 101. The multiple outer electrodes 107 on the front face 101*a* of the silicon substrate 101 may be arranged in a pattern different from a pattern on the bottom face 101*b* of the silicon substrate 101 or may be arranged in the same pattern as on the bottom face 101*b* of the silicon substrate 101. The terminals 104 and the interconnection lines 106 are preferably covered with the respective solder resist films 108 on both the front face 101*a* and the bottom face 101*b* of the silicon substrate 101.

Since the outer electrodes 107 and the interconnection lines 106, corresponding to the terminals 104 of the functional part 102, are formed on both the front face 101*a* and the bottom face 101*b* of the semiconductor device 100, either the front face 101*a* or the bottom face 101*b* of the semiconductor device 100 can be mounted on, for example, a mount board. Connecting more than one outer electrode 107 to each of the terminals 104 on both the front face 101*a* and the bottom face 101*b* of the silicon substrate 101 allows the position of the used outer electrode 107 to be varied. This structure significantly increases the flexibility in mounting.

The outer electrodes 107 on the front face 101*a* of the silicon substrate 101 are preferably arranged plane symmetrically with the outer electrodes 107 on the bottom face 101*b* of the silicon substrate 101. In addition, more than one outer electrode 107 is preferably connected to each of the terminals 104 on both the front face 101*a* and the bottom face 101*b* of the silicon substrate 101, and the outer electrodes 107 are preferably arranged line or point symmetrically with each other on both the front face 101*a* and the bottom face 101*b* of the silicon substrate 101.

Such arrangement eliminates the need to discriminate between the front face and the bottom face of the silicon substrate 101, thus easily mounting either the front face or the bottom face of the semiconductor device 100 on, for example, a mount board. A square silicon substrate 101 eliminates the need to discriminate the orientation of the semiconductor device 100, thus further increasing the flexibility in mounting the semiconductor device 100.

Figure 3:
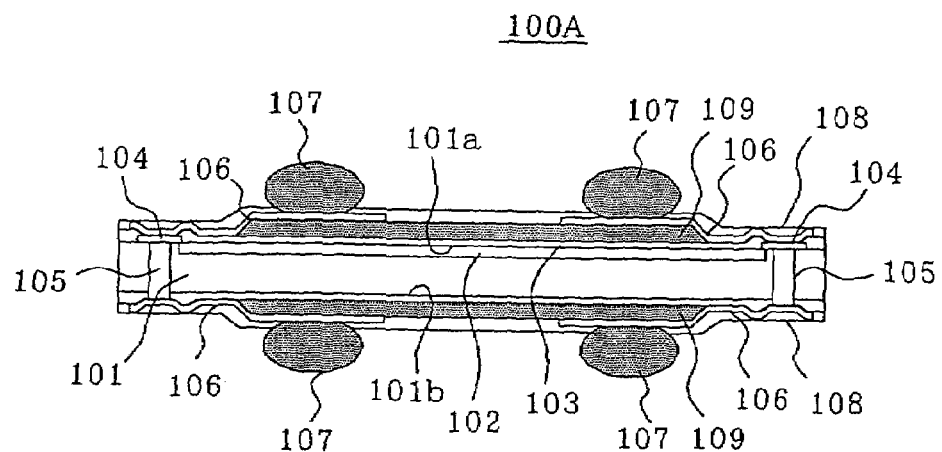
FIG. 3 is a schematic sectional view showing the structure of another semiconductor device according to the first embodiment of the present invention.

FIG. 3 is a schematic sectional view showing the structure of another semiconductor device 100A according to the first embodiment of the present invention. The semiconductor device 100A in FIG. 3 differs from the semiconductor device 100 in FIG. 1 in that stress relief layers 109 having the same shape and arrangement are respectively formed over the functional part 102 in the front face 101*a* of the silicon substrate 101 and on the bottom face 101*b* of the silicon substrate 101. The interconnection lines 106 and the outer electrodes 107 are formed on the stress relief layers 109. The stress relief layers 109 are made of photosensitive polyimide resin, silicon-modified polyimide resin, epoxy resin, silicon-modified epoxy rein, or the like.

Providing the respective stress relief layers 109 on both the front face 101*a* and the bottom face 101*b* of the silicon substrate 101 in the same manner allows the difference between the thermal expansion coefficient of the semiconductor device 100A and that of a mount board (or mount boards) to be accommodated when the front face 101*a* or the bottom face 101*b* of the silicon substrate 101 is mounted on the mount board or both the front face 101*a* and the bottom face 101*b* of the silicon substrate 101 are mounted on the mount boards. Accordingly, the mounting reliability of the semiconductor device 100A is substantially improved.

Figure 4:
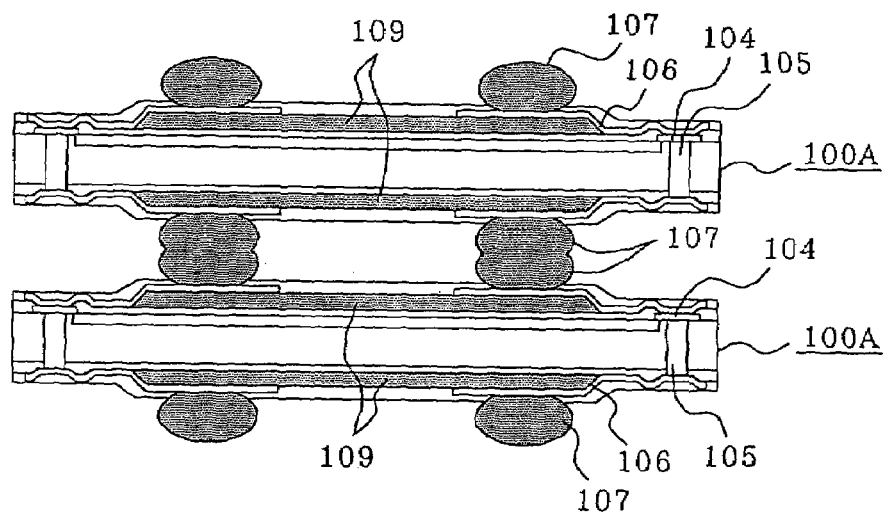
FIG. 4 is a schematic sectional view showing the structure of a multilayer semiconductor device according to the first embodiment of the present invention.

FIG. 4 is a schematic sectional view showing the structure of a multilayer semiconductor device according to the first embodiment of the present invention. The multilayer semiconductor device in FIG. 4 is formed by layering the semiconductor devices 100A shown in FIG. 3 in their thickness direction through the outer electrodes 107. This structure can be applied to the semiconductor device 100, having no stress relief layer, shown in FIG. 1. Adopting the multilayer structure can easily increase the packaging density of the semiconductor devices.

Figure 5:
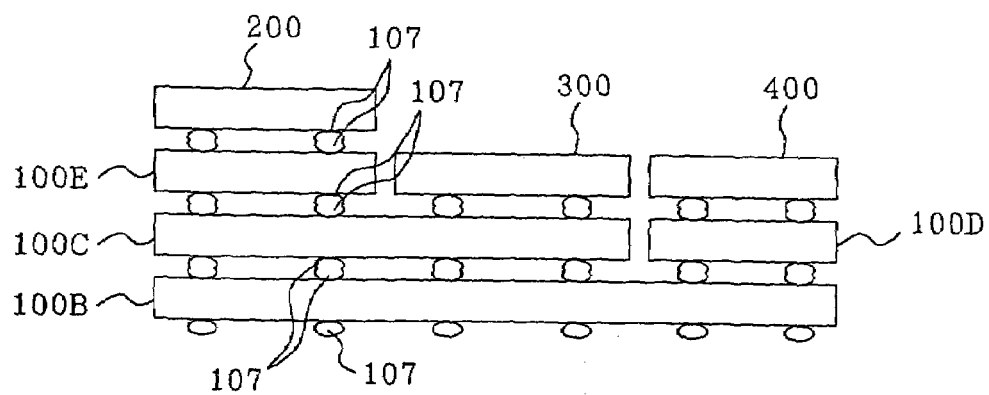
FIG. 5 is a schematic sectional view showing the structure of another multilayer semiconductor device according to the first embodiment of the present invention.

FIG. 5 is a schematic sectional view showing the structure of another multilayer semiconductor device according to the first embodiment of the present invention. This multilayer semiconductor device is formed by layering semiconductor devices 100B to 100E of the present invention, formed in the manner shown in FIG. 1 or FIG. 3, in their thickness direction through the outer electrodes 107 and layering other semiconductor devices 200, 300 and 400, which are not according to the present invention, on the top face. The semiconductor devices 100B to 100E differ from each other in their sizes and/or functions. Such a structure can further increase the packaging density of the semiconductor devices. In addition, layering semiconductor devices having different functions can form a system block.

In the multilayer semiconductor device shown in FIG. 4 or 5, designing the structure such that the outer electrodes of different semiconductor devices are capable of being electrically and physically connected to each other, if required, allows the semiconductor devices to be easily connected without using intermediate substrates or others between the semiconductor devices.

Second Embodiment

Figure 6:
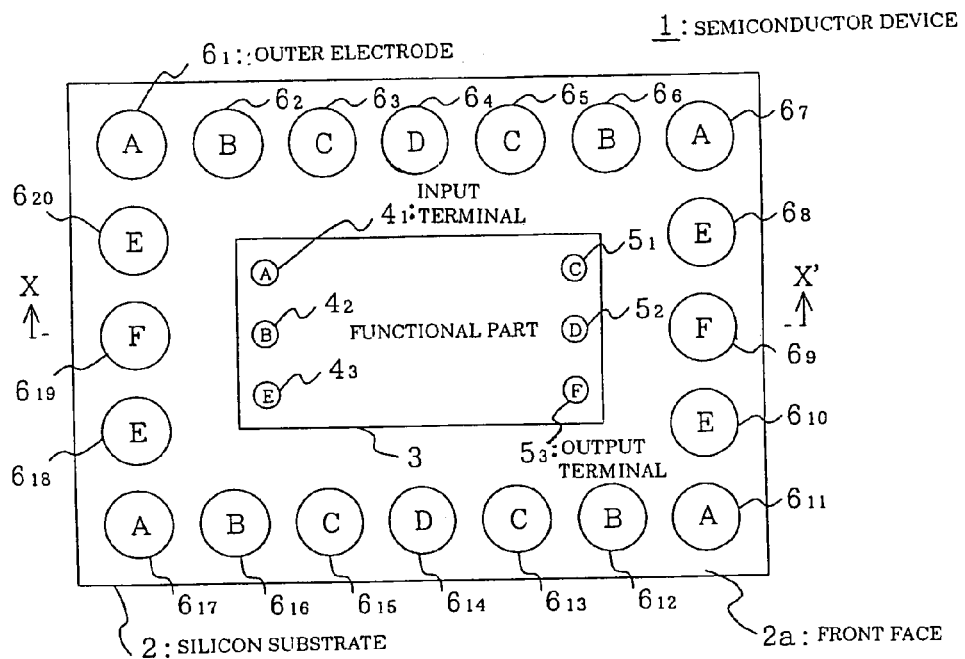
FIG. 6 is a diagram showing the arrangement of terminals and outer electrodes on the front face of a semiconductor device according to a second embodiment of the present invention.
Figure 7:
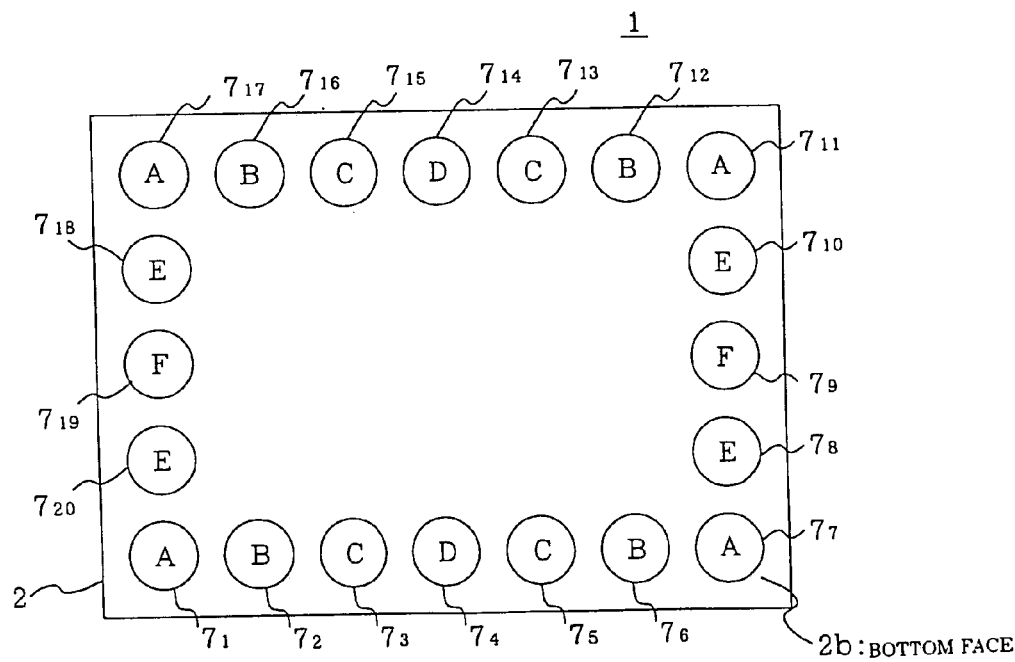
FIG. 7 is a diagram showing the arrangement of terminals and outer electrodes on the bottom face of the semiconductor device in FIG. 6.
Figure 8:
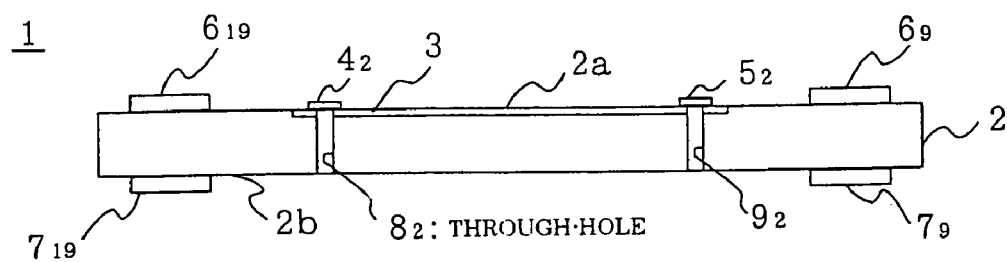
FIG. 8 is a cross-sectional view of the semiconductor device in FIG. 6 taken along line X–X'.

FIG. 6 is a schematic top view of a semiconductor device 1, which is an electronic component according to a second embodiment of the present invention. FIG. 7 is a schematic bottom view of the semiconductor device 1 in FIG. 6. FIG. 8 is a cross-sectional view of the semiconductor device 1 in FIG. 6 taken along line X–X'.

The semiconductor device 1 has a rectangular silicon substrate 2 and a functional part 3. The functional part 3 is formed beneath a substantially central part of a front face 2*a* and in the vicinity of the front face 2*a* of the silicon substrate 2. Outer electrodes $6_1$ to $6_{20}$ are formed near the margin of the front face 2*a* of the silicon substrate 2. Outer electrodes $7_1$ to $7_{20}$ are formed near the margin of a bottom face 2*b* of the silicon substrate 2. The outer electrodes $6_1$ to $6_{20}$ are hereinafter collectively referred to as outer electrodes 6. The same applies to the outer electrodes $7_1$ to $7_{20}$ and other components whose reference numerals have subscripts. The same applies to other embodiments described below.

The functional part 3 has a single active element or at least one active element and at least one passive element. In order to carry out a predetermined function, the functional part 3 performs a variety of signal processing, including arithmetic processing, image processing, speech synthesis, sound analysis, noise reduction, frequency analysis, encryption, decryption, and authentication, for input signals supplied from input terminals 4 ($4_1$ to $4_3$) to generate output signals that are output from output terminals 5 ($5_1$ to $5_3$). The input terminals $4_1$ to $4_3$ and the output terminals $5_1$ to $5_3$ are formed near the margin of the functional part 3 beneath the front face 2a of the silicon substrate 2. Although the only the input terminals $4_1$ to $4_3$ and the output terminals $5_1$ to $5_3$ are shown in FIG. 6 for simplicity, the functional part 3 ordinarily has, in addition to the input terminals $4_1$ to $4_3$ and the output terminals $5_1$ to $5_3$, a power terminal for supplying a power-supply voltage and a ground terminal for supplying a ground voltage. The input and output terminals, the power terminal, and the ground terminal are collectively referred to as terminals.

The outer electrodes $6_1$ to $6_{20}$ and the outer electrodes $7_1$ to $7_{20}$ are formed of, for example, a metal film made of aluminum (Al) or copper (Cu) or an alloy film including aluminum (Al) or copper (Cu). The outer electrodes $6_1$, $6_7$, $6_{11}$, and $6_{17}$ are connected to each other through lines (not shown) formed on the front face 2a or in the vicinity of the front face 2a of the silicon substrate 2. At least one of the outer electrodes $6_1$, $6_7$, $6_{11}$, and $6_{17}$ is connected to the input terminal $4_1$ in the functional part 3 through an interconnection line (not shown). Similarly, the outer electrodes $6_2$, $6_6$, $6_{12}$, and $6_{16}$ are connected to each other through lines (not shown) formed on the front face 2a or in the vicinity of the front face 2a of the silicon substrate 2. At least one of the outer electrodes $6_2$, $6_6$, $6_{12}$, and $6_{16}$ is connected to the input terminal $4_2$ in the functional part 3 through an interconnection line (not shown). The outer electrodes $6_3$, $6_5$, $6_{13}$, and $6_{15}$ are connected to each other through lines (not shown) formed on the front face 2a or in the vicinity of the front face 2a of the silicon substrate 2. At least one of the outer electrodes $6_3$, $6_5$, $6_{13}$, and $6_{15}$ is connected to the output terminal $5_1$ in the functional part 3 through an interconnection line (not shown). The outer electrodes $6_4$ and $6_{14}$ are connected to each other through lines (not shown) formed on the front face 2a or in the vicinity of the front face 2a of the silicon substrate 2. At least one of the outer electrodes 64 and $6_{14}$ is connected to the output terminal 52 in the functional part 3 through an interconnection line (not shown). The outer electrodes $6_8$, $6_{10}$, $6_{18}$, and $6_{20}$ are connected to each other through lines (not shown) formed on the front face 2a or in the vicinity of the front face 2a of the silicon substrate 2. At least one of the outer electrodes $6_3$, $6_5$, $6_{13}$, and $6_{15}$ is connected to the input terminal $4_3$ in the functional part 3 through an interconnection line (not shown). The outer electrode $6_9$ and $6_{19}$ are connected to each other through lines (not shown) formed on the front face 2a or in the vicinity of the front face 2a of the silicon substrate 2. At least one of the outer electrodes $6_9$ and $6_{19}$ is connected to the output terminal $5_3$ in the functional part 3 through an interconnection line (not shown).

The input terminal $4_1$ is led to the bottom face 2b of the silicon substrate 2 through a through-hole (not shown) that extends from the front face 2a of the silicon substrate 2 to the bottom face 2b thereof to be connected to an interconnection line (not shown) and is connected to at least one of the outer electrodes $7_1$, $7_7$, $7_1$, and $7_{17}$ through the interconnection line. The outer electrodes $7_1$, $7_7$, $7_{11}$, and $7_{17}$ are connected to each other through lines (not shown). Similarly, the input terminal $4_2$ is led to the bottom face 2b of the silicon substrate 2 through a through-hole $8_2$ that extends from the front face 2a of the silicon substrate 2 to the bottom face 2b thereof to be connected to an interconnection line (not shown) and is connected to at least one of the outer electrodes $7_2$, $7_6$, $7_{12}$, and $7_{16}$ through the interconnection line. The outer electrodes $7_2$, $7_6$, $7_{12}$, and $7_{16}$ are connected to each other through lines (not shown). The input terminal $4_3$ is led to the bottom face 2b of the silicon substrate 2 through a through-hole (not shown) that extends from the front face 2a of the silicon substrate 2 to the bottom face 2b thereof to be connected to an interconnection line (not shown) and is connected to at least one of the outer electrodes $7_8$, $7_{10}$, $7_{18}$, and $7_{20}$ through the interconnection line. The outer electrodes $7_8$, $7_{10}$, $7_{18}$, and $7_{20}$ are connected to each other through lines (not shown).

The output terminal $5_1$ is led to the bottom face 2b of the silicon substrate 2 through a through-hole (not shown) that extends from the front face 2a of the silicon substrate 2 to the bottom face 2b thereof to be connected to an interconnection line (not shown) and is connected to at least one of the outer electrodes $7_3$, $7_5$, $7_{13}$, and $7_{15}$ through the interconnection line. The outer electrodes $7_3$, $7_5$, $7_{13}$, and $7_{15}$ are connected to each other through lines (not shown). The output terminal $5_2$ is led to the bottom face 2b of the silicon substrate 2 through a through-hole $9_2$ that extends from the front face 2a of the silicon substrate 2 to the bottom face 2b thereof to be connected to an interconnection line (not shown) and is connected to at least one of the outer electrodes $7_4$ and $7_{14}$ through the interconnection line. The outer electrodes $7_4$ and $7_{14}$ are connected to each other through lines (not shown). The output terminal $5_3$ is led to the bottom face 2b of the silicon substrate 2 through a through-hole (not shown) that extends from the front face 2a of the silicon substrate 2 to the bottom face 2b thereof to be connected to an interconnection line (not shown) and is connected to at least one of the outer electrodes $7_9$ and $7_{19}$ through the interconnection line. The outer electrodes $7_9$ and $7_{19}$ are connected to each other through lines (not shown).

As shown in the cross-sectional view in FIG. 8, each through-hole preferably extends below the corresponding terminal 4 or 5. Since no active element ordinarily exists below the input terminal 4 or 5, the structure shown in FIG. 8 eliminates the need for allocating an area on the silicon substrate only for forming the through-hole, thus minimizing the area of the silicon substrate. In addition, in this structure, the terminals essential to the electronic component are utilized, so that a general-purpose component can be used without requiring a custom design of the electronic component, further, of the semiconductor device.

Figure 9:
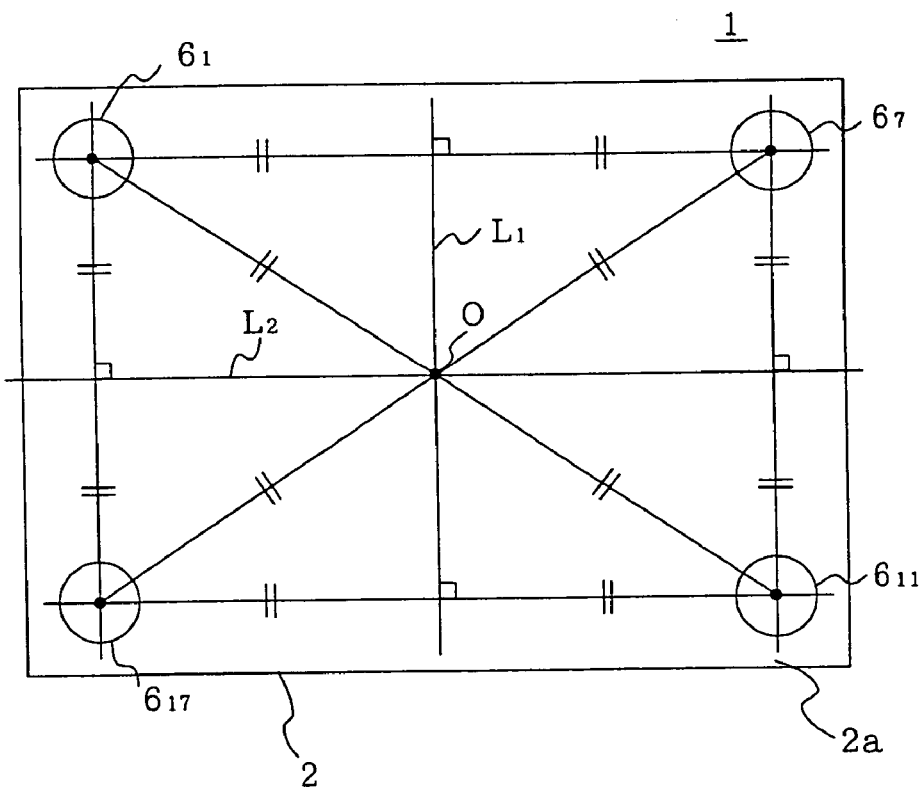
FIG. 9 is a schematic plan view illustrating the positional relationship among outer electrodes.

Referring to FIGS. 6 and 7, the input terminals 4, the output terminals 5, the outer electrodes 6, and the outer electrodes 7 having the same reference letters (capital letters) in the circles indicating their shapes are connected to each other. As apparent from FIGS. 6 and 7, among the outer electrodes $6_1$ to $6_{20}$ and the outer electrodes $7_1$ to $7_{20}$, the outer electrodes 6 that are on the front face 2a of the silicon substrate 2 and that are connected to one input terminal 4 or output terminal 5 are arranged symmetrically with the outer electrodes 7 that are on the bottom face 2b of the silicon substrate 2 and that are connected to the same input terminal 4 or the output terminal 5 as on the front face 2a. Specifically, for example, as for the outer electrodes $6_1$, $6_7$, $6_{11}$, and $6_{17}$ that are on the front face 2a of the silicon substrate 2 and that are connected to the input terminal $4_1$ in the functional part 3, as shown in FIG. 9, the outer electrode $6_1$ is line symmetric with the outer electrode $6_7$ with respect a line $L_1$, and the outer electrode $6_{11}$ is line symmetric with the outer electrode $6_{17}$ with respect to the line $L_1$. The outer electrode $6_1$ is line symmetric with the outer electrode $6_{17}$ with respect a line $L_2$, and the outer electrode $6_7$ is line symmetric with the outer electrode $6_1$, with respect to the line $L_2$. The outer electrode $6_1$ is point symmetric with the outer electrode $6_{11}$ with respect a midpoint O, and the outer electrode $6_7$ is point symmetric with the outer electrode $6_{17}$ with respect to the midpoint O.

Similarly, as for the outer electrodes $6_2$, $6_6$, $6_{12}$, and $6_{16}$ connected to the input terminal $4_2$ in the functional part 3, the outer electrode $6_2$ is line symmetric with the outer electrode $6_6$ with respect the line $L_1$ shown in FIG. 9, and the outer electrode $6_{12}$ is line symmetric with the outer electrode $6_{16}$ with respect to the line $L_1$. The outer electrode $6_2$ is line symmetric with the outer electrode $6_{16}$ with respect the line $L_2$ shown in FIG. 9, and the outer electrode $6_6$ is line symmetric with the outer electrode $6_{12}$ with respect to the line $L_2$. The outer electrode $6_2$ is point symmetric with the outer electrode $6_{12}$ with respect the midpoint O shown in FIG. 9, and the outer electrode $6_6$ is point symmetric with the outer electrode $6_{16}$ with respect to the midpoint O.

As for the outer electrodes $6_8$, $6_{10}$, $6_{18}$, and $6_{20}$ connected to the input terminal $4_3$ in the functional part 3, the outer electrode $6_8$ is line symmetric with the outer electrode $6_{20}$ with respect the line $L_1$ shown in FIG. 9, and the outer electrode $6_{10}$ is line symmetric with the outer electrode $6_{18}$ with respect to the line $L_1$. The outer electrode $6_8$ is line symmetric with the outer electrode $6_{10}$ with respect the line $L_2$ shown in FIG. 9, and the outer electrode $6_{20}$ is line symmetric with the outer electrode $6_{18}$ with respect to the line $L_2$. The outer electrode $6_8$ is point symmetric with the outer electrode $6_{18}$ with respect the midpoint O shown in FIG. 9, and the outer electrode $6_{20}$ is point symmetric with the outer electrode $6_{10}$ with respect to the midpoint O. The outer electrode $6_4$ is line symmetric with the outer electrode $6_{14}$ with respect to the line $L_2$ shown in FIG. 9. The outer electrode $6_9$ is line symmetric with the outer electrode $6_{19}$ with respect to the line $L_1$ shown in FIG. 9.

Also on the bottom face 2b of the silicon substrate 2, the outer electrodes $7_1$ to $7_{20}$ have the same symmetrical relationship as the outer electrodes 6 having the same subscripts. Specifically, for example, as for the outer electrodes $7_1$, $7_7$, $7_{11}$ and $7_{17}$, the outer electrode 61 is replaced with the outer electrode $7_{17}$ in FIG. 9, the outer electrode $6_7$ is replaced with the outer electrode $7_{11}$ in FIG. 9, the outer electrode $6_{11}$ is replaced with the outer electrode $7_7$ in FIG. 9, and the outer electrode $6_{17}$ is replaced with the outer electrode $7_1$ in FIG. 9. The outer electrode $7_1$ is line symmetric with the outer electrode $7_7$ with respect the line $L_1$, and the outer electrode $7_{11}$ is line symmetric with the outer electrode $7_{17}$ with respect to the line $L_1$. The outer electrode $7_1$ is line symmetric with the outer electrode $7_{17}$ with respect the line $L_2$, and the outer electrode $7_7$ is line symmetric with the outer electrode $7_{11}$ with respect to the line $L_2$. The outer electrode $7_1$ is point symmetric with the outer electrode $7_{11}$ with respect the midpoint O, and the outer electrode $7_7$ is point symmetric with the outer electrode $7_{17}$ with respect to the midpoint O. The same applies to the group of the outer electrodes $7_2$, $7_6$, $6_{12}$, and $6_{16}$, the group of the outer electrodes $7_3$, $7_5$, $7_{13}$, and $7_{15}$, the group of the outer electrodes $7_4$ and $7_{14}$, the group of outer electrodes $7_8$, $7_{10}$, $7_{18}$, and $7_{20}$, and the group of the outer electrodes $7_9$ and $7_{19}$. The outer electrodes $6_1$ to $6_{20}$ are plane symmetric with the outer electrodes $7_1$ to $7_{20}$ having the same subscripts with respect to a virtual plane including the midpoint between the front face 2a and the bottom face 2b of the silicon substrate 2.

The distance between the two adjacent outer electrodes among the outer electrodes $6_1$ to $6_{20}$ and the outer electrodes $7_1$ to $7_{20}$ is, for example, 0.5 mm. In contrast, the distance between the two adjacent input terminals among the input terminals $4_1$ to $4_3$ and the distance between two adjacent output terminals among the output terminals $5_1$ to $5_3$ are, for example, 100 µm.

Although an interlayer insulating film or a solder resist film is actually formed on the front face 2a of the silicon substrate 2 and the input terminals $4_1$ to $4_3$, the output terminals $5_1$ to $5_3$, or a wiring layer is formed on the interlayer insulating film or the solder resist film, the interlayer insulating film or the solder resist film is not shown in FIGS. 6 to 9. Formation of the interlayer insulating film or the solder resist film is not described in the following manufacturing process. The same applies to other embodiments described below.

Figure 10A:
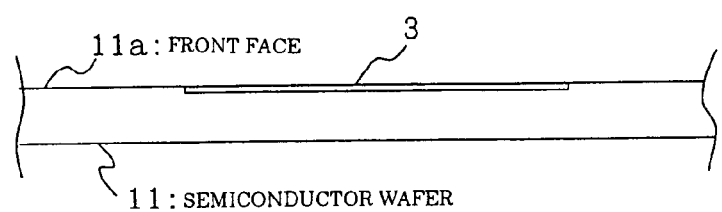
FIGS. 10A to 10D are diagrams illustrating a manufacturing process of the semiconductor device.
Figure 10B:
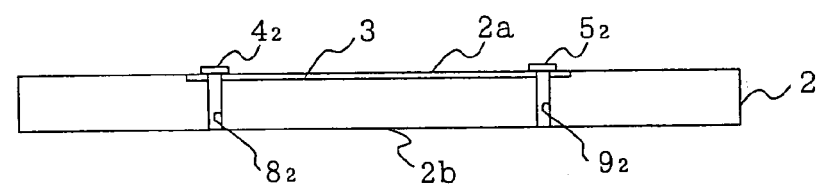

FIGS. 10A to 10D are diagrams illustrating a manufacturing process of the semiconductor device 1 having the structure described above. As shown in FIG. 10A, the process forms, by using a known semiconductor manufacturing technology, the functional parts 3, each having at least one active element and at least one passive element, beneath a front face 11a and in the vicinity of the front face 11a of a semiconductor wafer 11 that has a predetermined thickness and that is made of silicon. The process then cuts out rectangular silicon substrates 2 from the semiconductor wafer 11 by using a dicing device or the like. As shown in FIG. 10B, the process forms the input terminals $4_1$ to $4_3$ and the output terminals $5_1$ to $5_3$ near the margin of the functional part 3, and forms the corresponding through-holes extending from the front face 2a to the bottom face 2b to lead the input terminals 4 and the output terminals 5 from the front face 2a of the silicon substrate 2 to the bottom face 2b thereof. Each through-hole passes through the silicon substrate 2 at the positions below the corresponding input terminals $4_1$ to $4_3$ and output terminals $5_1$ to $5_3$. Only the input terminal $4_2$ the output terminal $5_2$, the through-hole $8_2$, and the through-hole $9_2$ are shown in FIG. 10B.

Figure 10C:
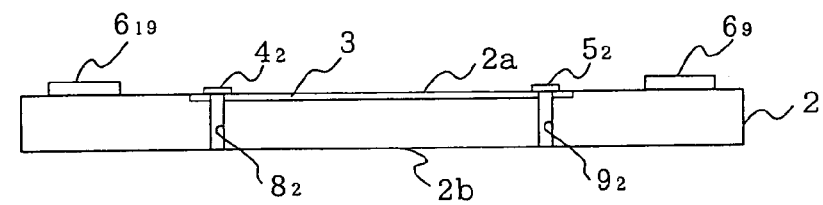

As shown in FIG. 10C, the process forms the outer electrodes $6_1$ to $6_{20}$ near the margin of the front face 2a of the silicon substrate 2, and forms interconnection lines (not shown) on the front face 2a or in the vicinity of the front face 2a of the silicon substrate 2 in order to connect the outer electrodes $6_1$, $6_7$, $6_{11}$, and $6_{17}$ to the input terminal $4_1$, Similarly, the process forms interconnection lines (not shown) on the front face 2a or in the vicinity of the front face 2a of the silicon substrate 2 in order to connect the outer electrodes $6_2$, $6_6$, $6_{12}$, and $6_{16}$ to the input terminal $4_2$. The process forms interconnection lines (not shown) on the front face 2a or in the vicinity of the front face 2a of the silicon substrate 2 in order to connect the outer electrodes $6_3$, $6_5$, $6_{13}$, and $6_{15}$ to the output terminal $5_1$. The process forms interconnection lines (not shown) on the front face 2a or in the vicinity of the front face 2a of the silicon substrate 2 in order to connect the outer electrodes $6_4$ and $6_{14}$ to the output terminal $5_2$. The process forms interconnection lines (not shown) on the front face 2a or in the vicinity of the front face 2a of the silicon substrate 2 in order to connect the outer electrodes $6_8$, $6_{10}$, $6_{18}$, and $6_{20}$ to the input terminal $4_3$. The process forms interconnection lines (not shown) on the front face 2a or in the vicinity of the front face 2a of the silicon substrate 2 in order to connect the outer electrodes $6_9$ and $6_{19}$ to the output terminal $5_3$. Although the formation of the outer electrodes $6_1$ to $6_{20}$ may be performed in a process different from the process performing the formation of the interconnection lines, the formation of the outer electrodes $6_1$ to $6_{20}$ and the formation of the interconnection lines are usually performed in the same process. Only the outer electrodes $6_9$ and $6_{19}$ are shown in FIG. 10C.

Figure 10D:
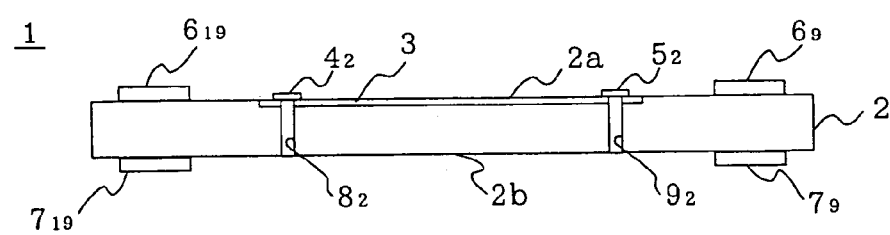

As shown in FIG. 10D, the process forms the outer electrodes $7_1$ to $7_{20}$ near the margin of the bottom face $2b$ of the silicon substrate 2 such that the outer electrodes $7_1$ to $7_{20}$ are plane symmetric with the outer electrodes $6_1$ to $6_{20}$ having the same subscripts with respect to a virtual plane including the midpoint between the front face $2a$ and the bottom face $2b$ of the silicon substrate 2. Concurrently, as in the outer electrodes $6_1$ to $6_{20}$, the process forms interconnection lines (not shown) on the front face $2a$ or in the vicinity of the front face $2a$ of the silicon substrate 2 in order to connect the outer electrodes $7_1$ to $7_{20}$ to the corresponding input or output terminals. The formation of the outer electrodes $7_1$ to $7_{20}$ and the formation of the interconnection lines are usually performed in the same process. Only the outer electrodes $6_9$, $6_{19}$, $7_9$, and $7_{19}$ are shown in FIG. 10D.

The semiconductor device 1 manufactured in the manner described above has the functional part 3, which is formed beneath the front face $2a$ of the silicon substrate 2 and carries out a predetermined function, and the outer electrodes $6_1$ to $6_{20}$ and the outer electrodes $7_1$ to $7_{20}$, for connecting the input terminals $4_1$ to $4_3$ and the output terminals $5_1$ to $5_3$ in the functional part 3 to external devices. The outer electrodes $6_1$ to $6_{20}$ and the outer electrodes $7_1$ to $7_{20}$ are provided on both the front face $2a$ and the bottom face $2b$ of the silicon substrate 2 in order to mount the silicon substrate 2 on, for example, a mount board without discriminating between the front face $2a$ and the bottom face $2b$ of the silicon substrate 2, and are connected to the corresponding input terminals 4 or output terminals 5.

There is no need to use an expensive mounter to mount the semiconductor devices 1 having the structure described above. Instead of using a mounter, for example, a mounting method by using so-called vibration positioning or a mounting method by using so-called external-shape positioning can be adopted. In the vibration positioning, the semiconductor devices 1 are positioned over the surface of a mount board that is carried while being vibrated. In the external-shape positioning, the semiconductor devices 1 are positioned based on only their external shapes, instead of positioning the individual semiconductor devices 1 on the surface of a mount board with a high precision. Accordingly, the mounting process can be largely simplified, thus reducing the price of the electronic apparatus such as an IC card, which includes a small number of electronic components, such as the semiconductor devices 1, to be mounted but which is manufactured in large quantities. Furthermore, the price of a display device that uses a large display, such as an OLED, a PDP, or an LCD, and that has a large number of data drivers mounted therein can also be reduced.

In the semiconductor device 1, the distance between the two adjacent outer electrodes among the outer electrodes $6_1$ to $6_{20}$ and the distance between two adjacent outer electrodes among the outer electrodes $7_1$ to $7_{20}$ are, for example, 0.5 mm. In contrast, the distance between the two adjacent input terminals among the input terminals $4_1$ to $4_3$ and the distance between two adjacent output terminals among the output terminals $5_1$ to $5_3$ are, for example, 100 μm. In other words, the pitch of the outer electrodes 6 and the outer electrodes 7 is changed from the pitch of the input terminals 4 and the output terminals 5 to the pitch that can be used in a general-purpose mounting device, such as a reflow device, capable of collective mounting. Hence, there is no need to use an individual mounting method, such as flip-chip mounting, thus largely simplifying the mounting process and reducing the number of mounting steps.

The outer electrodes $6_1$ to $6_{20}$ are formed on the front face $2a$ of the silicon substrate 2 and the outer electrodes $7_1$ to $7_{20}$ are formed on the bottom face $2b$ of the silicon substrate 2 in the semiconductor device 1, so that an electrical inspection can be performed after the semiconductor device 1 is mounted.

Although not shown, bumps may be formed on the outer electrodes by a known method by using, for example, gold or solder. In such a case, since various secondary mounting methods can be adopted, the mount capability is further improved.

The method of manufacturing the semiconductor device 1 described above can be applied to manufacturing the semiconductor device according to the first embodiment or a semiconductor device according to the third or fourth embodiment described below.

Third Embodiment

Figure 11:
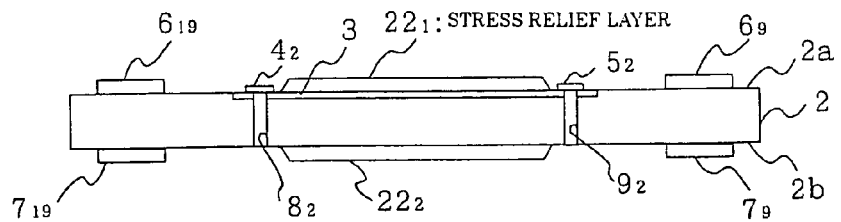
FIG. 11 is a schematic cross-sectional view showing the structure of a semiconductor device according to a third embodiment of the present invention.

FIG. 11 is a schematic cross-sectional view showing the structure of a semiconductor device 21, which is an electronic component according to a third embodiment of the present invention. The same reference numerals are used in FIG. 11 to identify the same components shown in FIGS. 6 to 8. A detailed description of such components is omitted here. In the semiconductor device 21 shown in FIG. 11, a stress relief layer $22_1$ having a substantially trapezoidal cross section is formed on the substantially central part of the front face $2a$ of the silicon substrate 2. In addition, a stress relief layer $22_2$ having the same shape as the stress relief layer $22_1$ is formed on the substantially central part of the bottom face $2b$ of the silicon substrate 2. The stress relief layer $22_1$ is plane symmetric with the stress relief layer $22_2$ with respect a virtual plane including the midpoint between the front face $2a$ and the bottom face $2b$ of the silicon substrate 2. The stress relief layer $22_1$ and the stress relief layer $22_2$ are made of, for example, photosensitive polyimide resin, silicon-modified polyimide resin, epoxy resin, silicon-modified epoxy rein, or the like. The stress relief layer $22_1$ and the stress relief layer $22_2$ are formed before or after the step of forming the outer electrodes and the interconnection lines in the process shown in FIGS. 10A to 10D. The semiconductor device 21 of the third embodiment has the advantage of relief of the thermal stress of the functional part 3 owing to the stress relief layer $22_1$ to remarkably improve the reliability, in addition to the effect achieved by the semiconductor device 1 of the second embodiment. Furthermore, the presence of the stress relief layer $22_1$ and the stress relief layer $22_2$ provides a symmetric structure, thus remarkably improving the reliability of the temperature cycle resistance when there is a difference in the thermal expansion coefficient between the front face and the bottom face of the semiconductor device 21.

Fourth Embodiment

Figure 12:
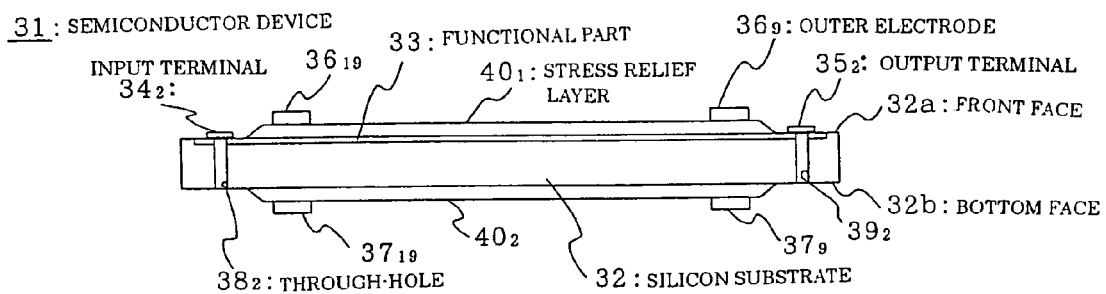
FIG. 12 is a schematic cross-sectional view showing the structure of a semiconductor device according to a fourth embodiment of the present invention.

FIG. 12 is a schematic cross-sectional view showing the structure of a semiconductor device 31, which is an electronic component according to a fourth embodiment of the present invention. The semiconductor device 31 basically has the same structure as the semiconductor device 100A described in the first embodiment.

The semiconductor device 31 has a functional part 33 formed beneath almost the entire area of a front face $32a$ and in the vicinity of the front face $32a$ of a rectangular silicon substrate 32. Input terminals $34_1$ to $34_3$ and output terminals $35_1$ to $35_3$ are formed near the margin of the functional part 33. A stress relief layer $40_1$ having a substantially trapezoidal cross section is formed over the surface of the functional part 3. In addition, a stress relief layer $40_2$ having the same shape as the stress relief layer $40_1$ is formed in an area that is plane symmetric with the stress relief layer $40_1$ with respect to a vertical plane including the midpoint between the front face $32a$ and a bottom face $32b$, on a bottom face $32b$ of the silicon substrate 32. Outer electrodes $36_1$ to $36_{20}$ are formed near the margin of the stress relief layer $40_1$. Outer electrodes $37_1$ to $37_{20}$ are formed near the margin of the stress relief layer $40_2$. The input terminal $34_2$ among the input terminals $34_1$ to $34_3$, the output terminal $35_2$ among the output terminals $35_1$ to $35_3$, the outer electrodes $36_9$ and $36_{19}$ among the outer electrodes $36_1$ to $36_{20}$, and the outer electrodes $37_9$ and $37_{19}$ among the outer electrodes $37_1$ to $37_{20}$ are shown in FIG. 12.

The input terminals $34_1$ to $34_3$ are led to the bottom face $32b$ of the silicon substrate 32 through the corresponding through-holes that extend from the front face $32a$ of the silicon substrate 32 to the bottom face $32b$ thereof. The output terminals $35_1$ to $35_3$ are led to the bottom face $32b$ of the silicon substrate 32 through the corresponding through-holes that extend from the front face $32a$ of the silicon substrate 32 to the bottom face $32b$ thereof. Only the through-holes $38_2$ and $39_2$ corresponding to the input terminal $34_2$ and the output terminal $35_2$, respectively, among the through-holes, are shown in FIG. 12.

Referring to FIG. 12, the input terminals $34_1$ to $34_3$, the output terminals $35_1$ to $35_3$, the outer electrodes $36_1$ to $36_{20}$, and the outer electrodes $37_1$ to $37_{20}$ have the same positional and connectional relationship as among the input terminals $4_1$ to $4_3$, the output terminals $5_1$ to $5_3$, the outer electrodes $6_1$ to $6_{20}$, and the outer electrodes $7_1$ to $7_{20}$ in the second embodiment described above, except that the input terminals $34_1$ to $34_3$ and the output terminals $35_1$ to $35_3$ are provided at positions closer to the margin of the silicon substrate $32_1$ compared with the outer electrodes $36_1$ to $36_{20}$ and the outer electrodes $37_1$ to $37_{20}$, respectively. Accordingly, a detailed description of the positional and connectional relationship is omitted here. The stress relief layer $40_1$ and the stress relief layer $40_2$ are made of the same material as that of the stress relief layer $22_1$ and the stress relief layer $22_2$ in the third embodiment. The stress relief layers $40_1$ and $40_2$ are formed before the formation of the outer electrodes and before the formation of the interconnection lines for connecting the outer electrodes to the corresponding terminals, in the process shown in FIGS. 10A to 10D. In the semiconductor device 31 of the fourth embodiment, in addition to the achievement of the effect the semiconductor device 1 of the second embodiment, the presence of the stress relief layer $40_1$ and the stress relief layer $40_2$ remarkably improves the reliability of the temperature cycle resistance when there is a difference in the thermal expansion coefficient between the mount board after the semiconductor device 31 is mounted and the semiconductor device 31.

Fifth Embodiment

Although the rectangular silicon substrates are shown in the above embodiments described above, the present invention is not limited to this shape. For example, a square silicon substrate may be adopted. In this case, since the external shape of the semiconductor device has rotational symmetry and there is no need to discriminate the orientation of the semiconductor device, the mounting process can be remarkably simplified.

Sixth Embodiment

Although the embodiments described above do not make particular reference to the overall shape of the semiconductor device, the semiconductor device preferably has a width and a depth larger than its thickness. This is because the semiconductor device cannot be stably fit in a recess for the semiconductor device in the mount board when the semiconductor device has a width and a depth smaller than or equal to its thickness.

Seventh Embodiment

Although the terminals are formed at plane positions different from those of the outer electrodes in the embodiments described above, the present invention is not limited to these positions. For example, the outer electrodes may be formed on the terminals. The structure according to a seventh embodiment eliminates the need for allocating areas in the functional part only for forming the outer electrodes, thus minimizing the area of the functional part and, further, the area of the silicon substrate.

Eighth Embodiment

Although the input and output terminals of the silicon substrate are led from the front face to the bottom face of the silicon substrate through the through-holes extending through the silicon substrate in the embodiments described above, the present invention is not limited to this structure. For example, a so-called contact plug in which a conductive material is embedded inside the through-hole may be formed, instead of the through-hole.

Ninth Embodiment

Although the present invention is applied to the semiconductor devices in the embodiments described above, the present invention is not limited to such application. For example, the present invention can also be applied to a module having at least one active element and at least one passive element in its functional part or to various electronic components, each having at least one semiconductor device mounted on a printed circuit board and at least one passive part in its functional part.

Tenth Embodiment

Although the embodiments described above do not make particular reference to surface finishing of the outer electrode, the outer electrode formed on the front face of the substrate is preferably subjected to the same surface finishing as in the outer electrode formed on the bottom face of the substrate. The surface finishing means, for example, a method of forming a bump or the material of a bump (e.g. gold(Au), nickel(Ni)-gold(Au), or solder (particularly, lead-free solder)), and a method of forming solder paste, flux, or others and the material of them (e.g. tin(Sn)-silver(Ag)-copper(Cu), tin(Sn)-silver(Ag), or tin(Sn)-silver(Ag)-bismuth(Bi)-copper(Cu)). This is because there is no need to discriminate the front face and the bottom face of the electronic component for mounting the electronic component when the outer electrode formed on the front face of the substrate is subjected to the same surface finishing as in the outer electrode formed on the bottom face of the substrate. In such a case, the same mounting method including reflow mounting, flip-chip mounting, or face-down mounting can be used to remarkably simplify the mounting process.

Eleventh Embodiment

Figure 13:
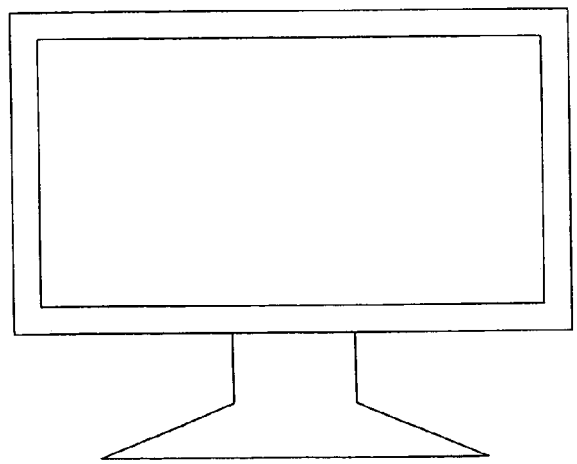
FIG. 13 shows an example of a display device, which is an electronic apparatus in which the electronic components of the present invention are mounted.

An electronic apparatus in which the semiconductor device according to the present invention is mounted is, for example, a display device shown in FIG. 13. However, the electronic apparatus in which the semiconductor device according to the present invention is mounted is not limited to this display device and includes an IC card and a cell phone. Since the semiconductor device can be easily mounted on the electronic apparatus according to the present invention in various manners, as described above, it is possible to reduce the size and cost of the electronic apparatus. Furthermore, the electronic apparatus in which the semiconductor devices having the outer electrodes and the interconnection lines formed on their stress relief layers are mounted can improve its reliability and/or lengthen its life as the reliability of the semiconductor device is improved.

It will be further understood by those skilled in the art that the foregoing description with reference to the attached drawings is of the embodiments of the present invention and that various changes and modifications may be made to the invention without departing from the spirit and scope thereof.

For example, each of the semiconductor devices in the embodiments described above may be layered to form a multilayer semiconductor device owing to the structure.

Each of the semiconductor devices described above may be utilized as a connector for connecting components provided on the front face and the bottom face of the semiconductor device, without using the functional part of the semiconductor device.

Although the functional parts 3, 33, and 102 are formed beneath the front faces of the silicon substrates 2, 32, and 101, respectively, in the semiconductor devices in the above embodiments, each functional part may be formed beneath the bottom face of the silicon substrate or may be formed beneath both the bottom face and the bottom face of the silicon substrate. Although the terminals 4, 5 and 104 for use in the connection to the functional parts 3, 33, 102 are formed on the front faces of the silicon substrates 2, 32, and 101 and are led to the bottom faces thereof in the semiconductor devices described above, the terminals may be formed on the bottom faces of the silicon substrates and led to the front faces thereof.

Although the silicon substrates 2 are cut out from the semiconductor wafer 11 after the functional parts 3 are formed on the semiconductor wafer 11 in the embodiments described above, the present invention is not limited to this method. The silicon substrates 2 may be cut out from the semiconductor wafer 11 after all the steps shown in FIGS. 10A to 10D are completed.

The embodiments described above can transfer their structures or methods to each other unless there is problem or contradiction in their objects or structures.

What is claimed is:

1. An electronic component comprising:
   a substrate;
   a functional part that is formed beneath at least one of a front face and a bottom face of the substrate and that performs a predetermined function;
   a plurality of terminals that is formed on the front face or the bottom face of the substrate and that is connected to the functional part;
   a plurality of outer electrodes formed on the front face and the bottom face of the substrate; and
   interconnection lines, formed on the front face and the bottom face of the substrate, for connecting the terminals on the front face or the bottom face of the substrate to the outer electrodes.

2. The electronic component according to claim 1, wherein the distance between two adjacent outer electrodes among the plurality of outer electrodes is larger than the distance between two adjacent terminals among the plurality of terminals.

3. The electronic component according to claim 1, further comprising stress relief layers formed on the front face and the bottom face of the substrate,
   wherein the outer electrodes and the interconnection lines are formed on the stress relief layers.

4. The electronic component according to claim 1,
   wherein the plurality of outer electrodes on the front face of the substrate are plane symmetric with the plurality of outer electrodes on the bottom face of the substrate,
   wherein the outer electrodes connected to the same terminal is provided on both the front face of the substrate and the bottom face thereof, and
   wherein the outer electrodes connected to the same terminal are line symmetric with each other, on both the front face of the substrate and the bottom face thereof.

5. The electronic component according to claim 1,
   wherein the plurality of outer electrodes on the front face of the substrate are plane symmetric with the plurality of outer electrodes on the bottom face of the substrate,
   wherein the outer electrodes connected to the same terminal is provided on both the front face of the substrate and the bottom face thereof, and
   wherein the outer electrodes connected to the same terminal are point symmetric with each other, on both the front face of the substrate and the bottom face thereof.

6. The electronic component according to claim 1,
   wherein the terminals are formed on the front face or the bottom face of the substrate through corresponding through-holes or plugs extending through the substrate.

7. The electronic component according to claim 6,
   wherein the through-holes or plugs are formed immediately below the corresponding terminals.

8. The electronic component according to claim 1,
   wherein the outer electrodes connected to the same terminal are subjected to the same surface finishing.

9. The electronic component according to claim 8,
   wherein the surface of each of the outer electrodes is subjected to the surface finishing using gold or solder.

10. The electronic component according to claim 1,
    wherein the substrate is square.

11. The electronic component according to claim 1,
    wherein the width and depth of the electronic component is larger than the thickness thereof.

12. The electronic component according to claim 1,
    wherein the substrate is a semiconductor substrate, and
    wherein the functional part includes at least one active element formed on the semiconductor substrate.

13. The electronic component according to claim 1,
    wherein the functional part includes a semiconductor device mounted on the substrate.

14. A multilayer electronic component having the electronic components according to claim 1 arbitrarily combined with each other and layered through the outer electrodes.

15. A multilayer electronic component having the electronic components according to claim 1 and other components layered through the outer electrodes.

16. An electronic apparatus having the electronic component according to claim 1 mounted.

17. A method of manufacturing an electronic component, the method comprising steps of:
    forming a functional part, performing a predetermined function, beneath at least one of a front face and a bottom face of a substrate;
    leading a plurality of terminals from one face of the two faces to the other faces thereof, the terminals being connected to the functional part and extending through the substrate; and
    forming a plurality of outer electrodes on the front face and the bottom face of the substrate to connect the outer electrodes to the corresponding terminals.

18. The method of manufacturing the electronic component according to claim 17,
    wherein, in the step of forming the plurality of outer electrodes, the plurality of outer electrodes on the front face of the substrate are plane symmetric with the plurality of outer electrodes on the bottom face of the substrate, and wherein the outer electrodes connected to the same terminal are line symmetric with each other, on both the front face of the substrate and the bottom face thereof.

19. The method of manufacturing the electronic component according to claim 17, wherein, in the step of forming the plurality of outer electrodes, the plurality of outer electrodes on the front face of the substrate are plane symmetric with the plurality of outer electrodes on the bottom face of the substrate, and wherein the outer electrodes connected to the same terminal are point symmetric with each other, on both the front face of the substrate and the bottom face thereof.

20. The method of manufacturing the electronic component according to claim 17, wherein the step of forming the plurality of outer electrodes is performed on stress relief layers after the stress relief layers are formed on the front face and the bottom face of the substrate.

* * * * *